United States Patent [19]
Yuan

[11] Patent Number: 5,940,789
[45] Date of Patent: Aug. 17, 1999

[54] STAGE CONTROL METHOD AND APPARATUS WITH VARYING STAGE CONTROLLER PARAMETER

[75] Inventor: Bausan Yuan, San Jose, Calif.

[73] Assignee: Nikon Corporation, Japan

[21] Appl. No.: 08/649,558

[22] Filed: May 17, 1996

[51] Int. Cl.$^6$ ................................................ G03B 27/42
[52] U.S. Cl. ........................ 702/150; 364/151; 355/53; 356/28.5
[58] Field of Search ..................... 364/559, 151, 364/148, 170, 182; 355/53, 77; 356/27, 28.5; 702/150

[56] References Cited

U.S. PATENT DOCUMENTS

| | | | |
|---|---|---|---|
| Re. 33,267 | 7/1990 | Kraus | 364/158 |
| 4,710,865 | 12/1987 | Higomura | 364/170 |
| 4,924,257 | 5/1990 | Kantilal . | |
| 5,255,347 | 10/1993 | Matsuba et al. | 395/23 |
| 5,268,834 | 12/1993 | Sanner et al. | 364/151 |
| 5,289,231 | 2/1994 | Iwata et al. . | |
| 5,371,669 | 12/1994 | Venkataraman et al. | 364/160 |
| 5,473,412 | 12/1995 | Ozawa | 355/77 |
| 5,477,304 | 12/1995 | Nishi | 355/53 |
| 5,663,783 | 9/1997 | Ueda | 355/53 |

OTHER PUBLICATIONS

Jere D. Buckley, et al., "Step–and–Scan Lithography Using Reduction Optics", The Perkin–Elmer Corporation, Optical Lithography Operations, 24 pgs., Undated.

*Primary Examiner*—Kamini Shah
*Attorney, Agent, or Firm*—Skjerven, Morrill, MacPherson, Franklin & Friel LLP; Norman R. Klivans

[57] ABSTRACT

An improvement in the performance characteristics of a controller for a high precision positioning system, by continuously updating a variable parameter in the controller transfer function in response to, and as a continuously monotonically decreasing function of, the measured position error signal, with a small error cutoff. The error convergence, noise, and stability characteristics of the controller are improved over that of a constant-parameter controller. The variable parameter can also be tailored to prevent saturation of the amplifier that is driven by the controller and which drives the mechanical system whose position is being controlled.

25 Claims, 4 Drawing Sheets

STAGE CONTROL METHOD AND APPARATUS WITH VARYING STAGE CONTROLLER PARAMETER

BACKGROUND OF THE INVENTION

1. Field of the Invention

This invention relates to a fine motion stage for high precision alignment of movable reticle and wafer stages in a scanning exposure apparatus for semiconductor lithography, as well as to other precision motion apparatuses.

2. Description of the Prior Art

In semiconductor lithography as used to fabricate integrated circuits, conventionally a reticle (mask) is imaged through a reduction-projection lens onto a semiconductor wafer located below the lens. A scanning exposure device uses simultaneous motion of the reticle and wafer (each supported on its own movable stage) to continuously project an image of a portion of the reticle onto the wafer through the projection lens and thereby expose a photosensitive resist layer on the wafer. Scanning, as opposed to exposure of the entire reticle at once, allows for projection of reticle patterns that exceed in size that of the image field of the projection lens.

Present FIG. 1 is similar to FIG. 1 of Nishi U.S. Pat. No. 5,477,304 issued Dec. 19, 1995 entitled "Projection Exposure Apparatus" assigned to Nikon Corporation and incorporated herein by reference. This illustrates a slit scanning exposure apparatus for semiconductor processing. A reticle base 19 is part of the stage system for a reticle 7. A reticle scanning stage 20 is placed on the reticle base 19 to be slideable in the X direction within the XY plane where the X axis is perpendicular to the drawing surface of FIG. 1 and the Y axis is parallel to the drawing surface of FIG. 1. The reticle 7 is held on the reticle fine adjustment stage 21. In an exposure operation a pattern area of the reticle 7 is illuminated by exposure light IL from an illumination optical system 22 in the form of a rectangular illumination area (i.e. a slit), and the reticle 7 is scanned in the X direction with respect to the slit-like illumination area. The illumination optical system 22 is conventional.

Three movable mirrors (only a single movable mirror 33 is shown) are disposed on the reticle fine adjustment stage 21. Three laser interferometers (only a single laser interferometer 35 is shown) obtain the positions and rotational angles of the reticle fine adjustment stage 21 within the XY plane. The measurement results obtained by these laser interferometers (position detectors) are supplied to a main control system 23. The main control system 23 controls the operation of the reticle scanning stage 20 through a relative scanning drive 24, and also controls operation of the reticle fine adjustment stage 21 through a fine adjustment drive 25.

In the exposure operation, a pattern in the slit-like illumination area under reticle 7 is projected/exposed on the wafer 14 through a projection optical system 13.

In the stage system for the wafer 14, an air guide elongated in the X direction is found on the wafer base 26 and a wafer X stage 27 is placed on the wafer base 26 to be slideable in the X direction in the XY plane. A wafer Y stage 28 is placed on the wafer X stage 27 to be movable in the Y direction within the XY plane. The wafer 14 is held on the wafer Y stage 28. Also present are a Z stage, a levelling stage and other elements conventionally arranged between the wafer Y stage 28 and the wafer 14. A stepping motor 29 is disposed on one end of the wafer X stage 27. The stepping motor 29 drives the wafer Y stage 28 in the Y direction by a ball screw 30.

Three movable mirrors (only a single movable mirror 45 is shown) are disposed on the wafer Y stage 28. Three laser interferometers (only a single laser interferometer 47B is shown) obtain the positions and rotational angles of the wafer Y stage 28 within the XY plane conventionally. The measurement results obtained by these laser interferometers are also supplied to the main control system 23. In accordance with the three position measurement results, the main control system 23 controls the operation of the wafer X stage 27 and the wafer Y stage 28 through a drive 31.

A typical control system of the type used in FIG. 1 for the reticle and wafer stages is shown schematically in FIG. 2 (FIGS. 2–4 use different reference numbers than does FIG. 1 for equivalent structures for greater clarity). High precision position synchronization of the (coarse) actuator for reticle stage 110 and the (coarse) actuator for wafer stage 112 is effected by a high-bandwidth, fine motion stage 116 driven by a PZT-type actuator 117 mounted on the reticle stage 110. (The reticle and wafer stages are shown for purposes of simplicity combined with their respective actuators.) Controller 120 provides control signals to fine motion stage amplifier 118, reticle stage actuator servo amplifier 122, and wafer stage actuator servo amplifier 124. Conventional position sensors (as described above and not shown here) sense the position of each of the fine stage 116, the reticle stage actuator 110, and wafer stage 112 and provide position indication signals to controller 120 which is e.g. a programmed microprocessor or microcontroller.

A motion control system for all three stages of FIG. 2 is shown schematically in FIG. 3. The input and output signals of FIG. 3 represent functions of the positions of the stages. The reticle stage 110 trajectory as illustrated is a constant multiple (for example, four) of the position command 115 from controller 120 and hence is four times that of the wafer stage 112. Also, the motions of reticle stage 110 and wafer stage 112 are actually in opposite directions because the projection lens of the type in the system of FIG. 1 typically is a reversing-type optics. These two factors account for the multiplications by −4 and 4, respectively, shown at the reticle stage 110 input (drive) signal and the wafer stage 112 output (position indication) signal in FIG. 3.

A typical closed-loop fine motion stage control feedback system for the fine motion stage 116 and its actuator 117 of FIG. 3 is shown in detail in block diagram form in FIG. 4. The input signal ("Desired Position") is the desired trajectory correction corresponding to the positional deviation between the reticle stage 110 and wafer stage 112, and the output signal ("Actual Position") is the actual position achieved by the fine motion stage 116. In addition, there is often a noise disturbance independent of the controller 120. Thus the output signal is the sum of a controlled output signal from the fine motion stage 16 and its actuator 117 plus a noise contribution, which together result in a position signal determined by the conventional position sensor associated with the fine motion stage 116 which senses e.g. the location of a side of fine motion stage 116.

The controller 120 functionally is characterized mathematically as a Laplace transform having a gain k, two real zeroes a1, a2, a simple pole at the origin, and a real simple pole b2. Mathematically, this function may be expressed as $$G(s) = k*(s+a1)(s+a2)/(s*(s+b2)),$$

where k, a1, a2 and b2 are constants chosen to achieve the desired controller performance and s is the Laplace transform complex operator. Typically b2>a2 and the value of b2 depends on the system structural frequency. Typically a2>a1 and the value of a2 depends on the system stability.

However, this prior art controller has the disadvantage that its performance (as measured by error convergence rate, noise reduction and stability), is determined solely by the particular constants that characterize the controller transfer function. Thus the characteristics of the controller cannot be varied with respect to the continuously changing instantaneous error.

SUMMARY

A system and method in accordance with this invention minimize the relative error between a pair of stages which, when driven simultaneously with a single input signal, are intended to move in perfect synchronization. In practice, there is some deviation between the positions of the two stages because of mechanical/environmental or electrical disturbances (noise) affecting the two stages. A fine motion stage is intended to compensate for this deviation.

The present approach replaces one of the constants in the fine motion stage controller position function (as described above) with a variable which is updated (e.g. continuously or discretely) and whose value depends on the instantaneous error signal (positional deviation between reticle stage and wafer stage) of the fine motion stage. In one embodiment, values of the variable corresponding to the error signal values are stored in a look-up table. By making this variable a monotonically decreasing function of the fine motion stage error signal, the error convergence rate, noise reduction, stability, and avoidance of amplifier saturation are improved over that of the above-described constant-parameter controller.

Therefore the present controller improves position synchronization (using the fine stage) of simultaneously driven reticle and wafer stages in a scanning exposure system for semiconductor lithography. This invention is not limited to semiconductor lithography but is generally applicable to high precision motion synchronization. Therefore while one application of this invention is to a scanning exposure apparatus as shown in FIG. 1, the invention is not so limited.

DETAILED DESCRIPTION

In accordance with the invention, the controller function G(s) expressed mathematically has the same general form as described above $$G(s)=k*(s+a1)(s+a2)/(s*(s+b2)),$$

with a2, b2 being constants and b2>a2. Variable s is the complex operator of the Laplace transform (as described above). Parameter a1 determines the steady state error; constants a2, b2 determined the degree of system stability. However, as shown graphically in FIG. 5, in accordance with the invention parameter a1 is not a constant value, but instead is a variable, monotonically decreasing function of the instantaneous error signal of the fine motion stage such that:

$$a1=a1(\text{error}) \text{ and}$$

$$a1(\text{error2})<a1(\text{error1}) \text{ for any error2>error1}$$

where "error" is the error signal and error1 and error2 are particular values of the error signal. Thus, the value of a1 varies, e.g. discretely or continuously.

Figure 1:
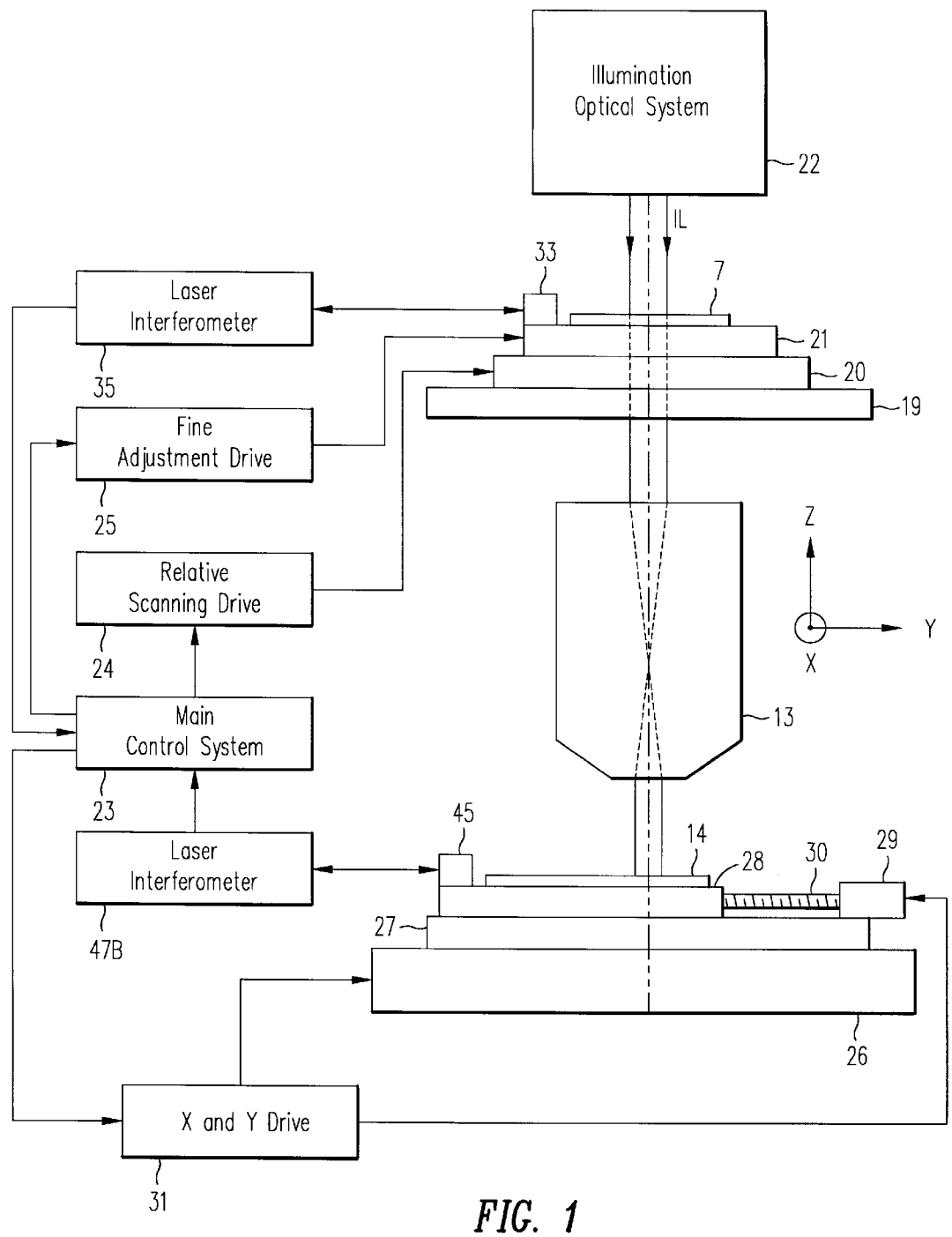
FIG. 1 shows a scanning exposure apparatus of the type known in the art and to which the present invention may be applied.
Figure 2:
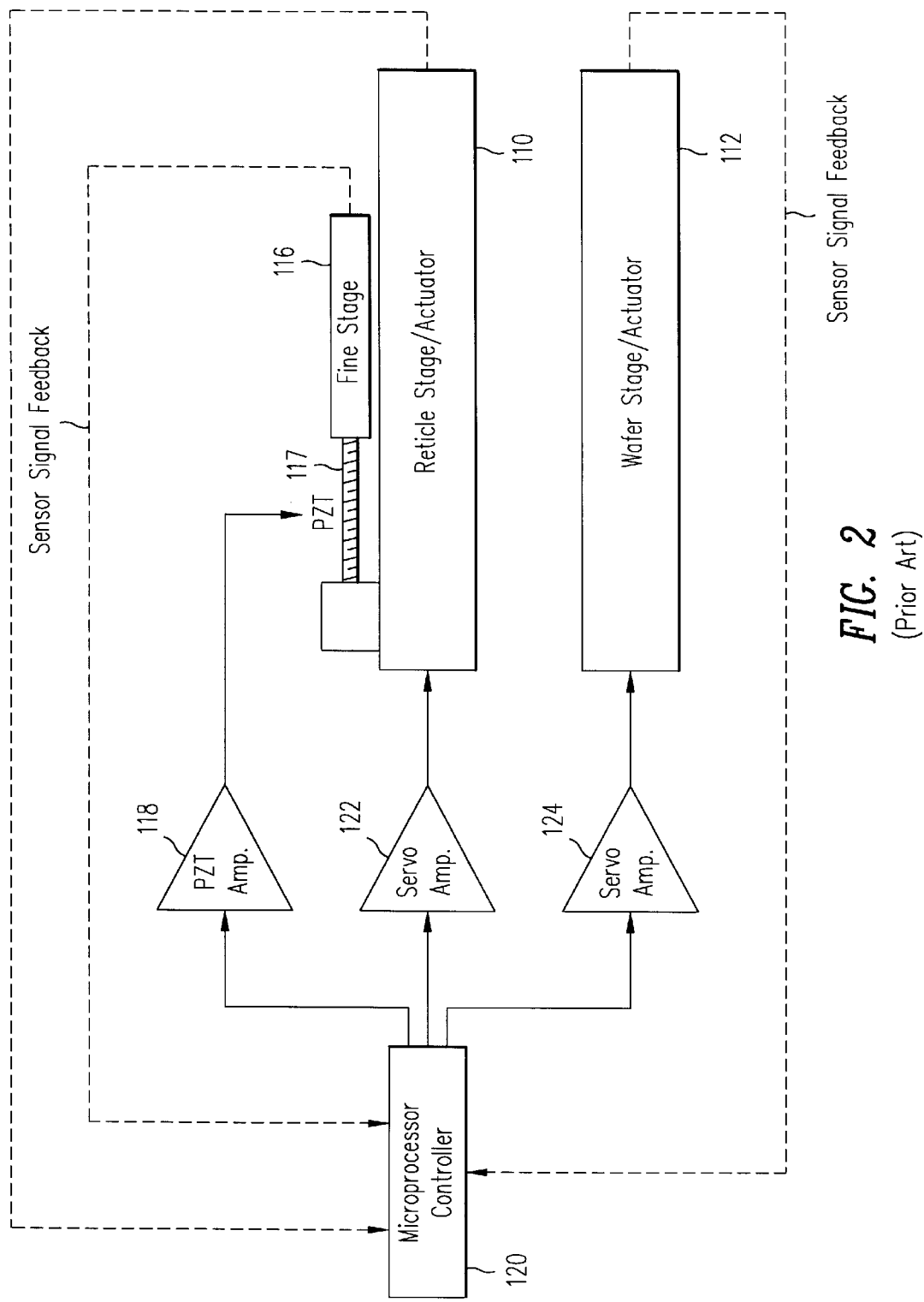
FIG. 2 shows schematically a prior art control system for synchronized stage positioning.
Figure 3:
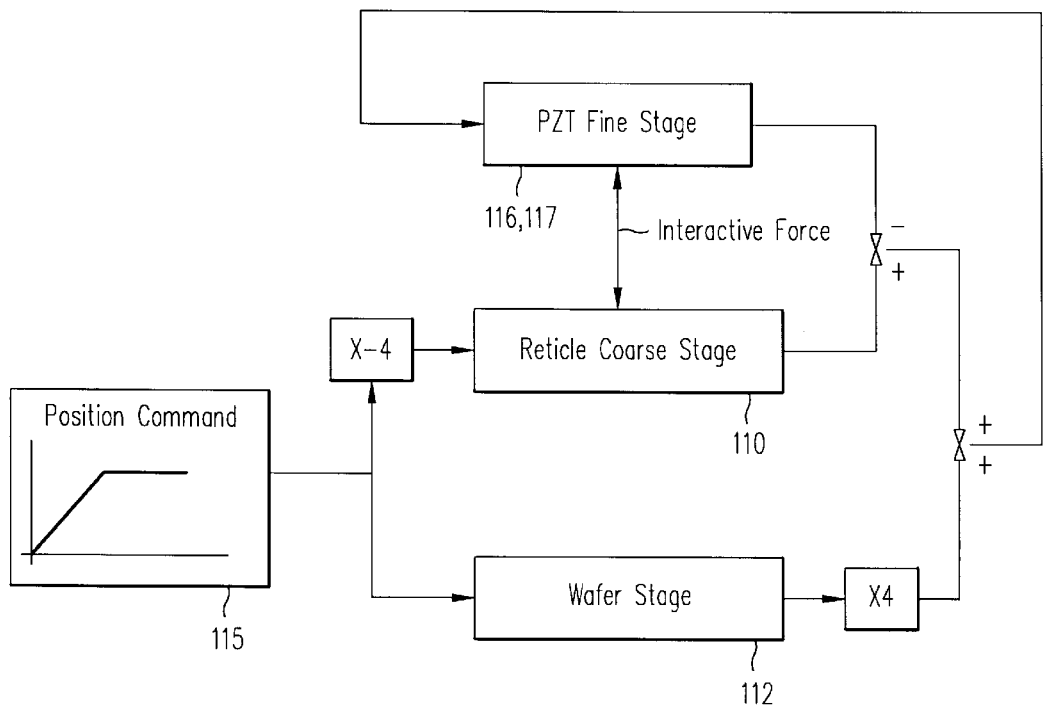
FIG. 3 shows schematically the control system associated with FIG. 2.
Figure 4:
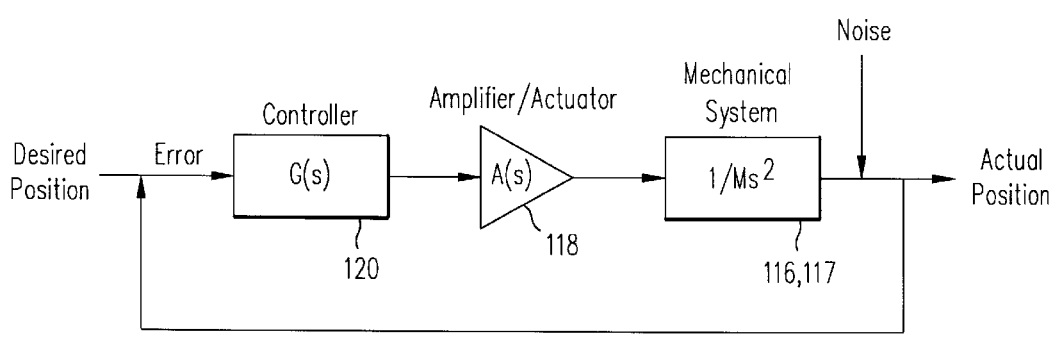
FIG. 4 shows a prior art closed-loop representation of the control system for the fine motion stage of FIG. 3.
Figure 5:
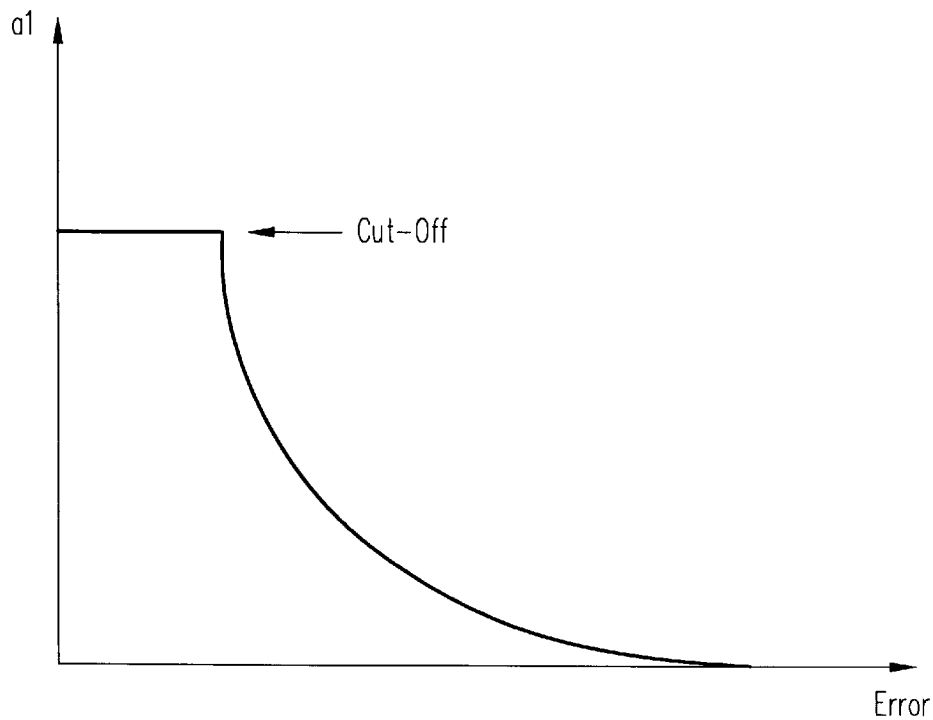
FIG. 5 shows graphically an improved controller parameter in accordance with the present invention.

Furthermore as shown in FIG. 5, for a large error signal value, the value of parameter a1 becomes zero corresponding to the saturation threshold of the controller amplifier 118 of FIG. 4. For a small error signal value, the value of parameter a1 is "cut off" at a maximum value to prevent the system from becoming unstable. (Saturation threshold is the maximum force the amplifier 118 and its associated actuator 117 can produce.) Thus the present stage control is the same as depicted in FIGS. 2, 3, and 4 except for the dynamically varying value of the parameter a1 in the controller function, e.g. when the controller function is expressed mathematically as a Laplace transform.

Figure 6:
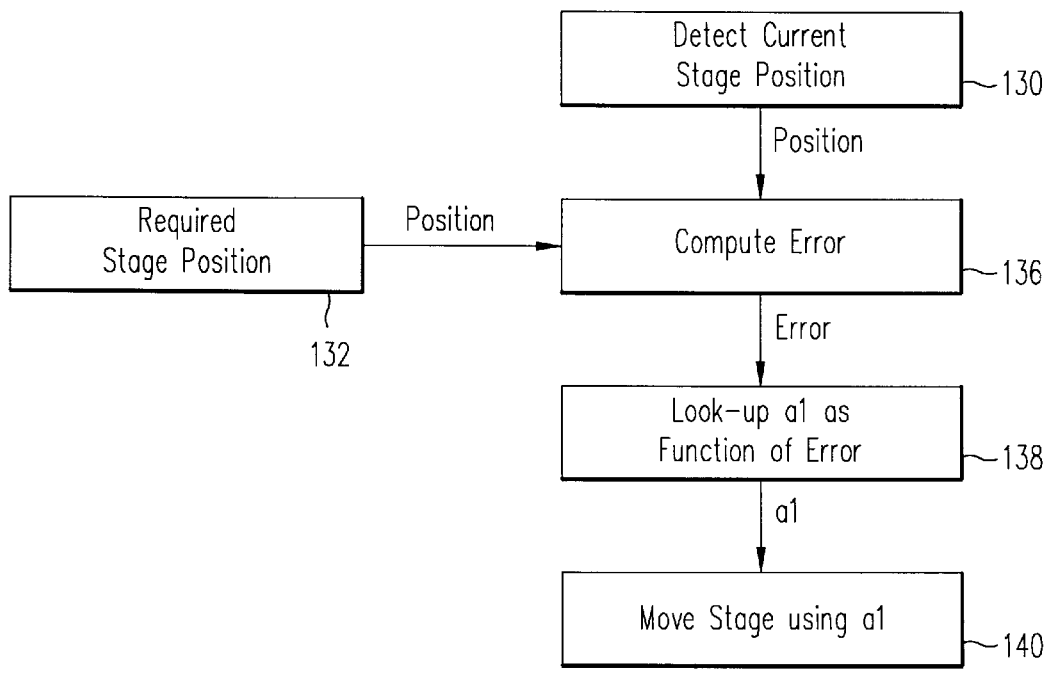
FIG. 6 is a flow chart of the present stage control method.

FIG. 6 is a flowchart showing the positioning method in accordance with this invention. First a current (actual) position of the fine stage is detected in step 130. A required position of the fine stage is supplied in step 132. In step 136, the error value is computed as a difference between the required position and the current position. In step 138, a value of the variable parameter a1 is selected corresponding to the error value, e.g. by being looked up in a data table. Then in step 140 the fine stage is driven to a position that is a function of the selected value of parameter a1 and the other controller function parameters.

One embodiment of such an approach is implemented as a computer program including a suitable look-up table for a1 and executed by controller 120, where a convenient form of the parameter a1 (expressed as a Laplace transform) is:

$$a1=\text{const}*|\text{error}|^\alpha, \text{ and } -1<\alpha<0, \text{ for } |\text{error}|>\text{error\_cutoff, and}$$

$$a1=\text{const}*|\text{error\_cutoff}|^\alpha \text{ for } |\text{error}|\leq\text{error\_cutoff}.$$

Here the value of error_cutoff corresponds to the saturation threshold of the fine stage amplifier 118. The controller 120 stores a function having a parameter that changes according to the error, in the form of the look-up table. However, parameter a1 is not restricted to this form. Rather as shown in FIG. 5, any continuously, monotonically decreasing function of the error signal with a small-error "cut-off" value and a large error zero value to avoid saturation of the amplifier will suffice.

A suitable computer program for the controller 20 to carry out this approach can be written by one of ordinary skill in the art given this description. Alternatively, another embodiment of the invention is in the form of circuitry (hardware) to carry out the controller function.

Thus the present controller, in Laplace transform terms, has a variable gain, a first real negative zero, a second real negative zero, a first simple pole at the origin, and a second real negative simple pole in the s-plane (complex plane). Further in the present controller, in Laplace transform terms, the second real simple pole is located to the right of the second real zero. Further, in Laplace transform terms, the location of the first real zero has a continuously variable value (i.e., a1) that decreases monotonically with an increasing instantaneous error signal given by the difference between the controller input location signal and the fine stage output location signal.

Further, for a large error signal, the location of the first real zero is limited to a minimum value corresponding to avoidance of saturation of the amplifier being driven by the controller.

In the present controller, the error convergence rate increases as the value of parameter a1 increases. Error convergence may be interpreted as the output location signal satisfactorily tracking the input signal. Thus, the error convergence rate is a measure of the system speed of response.

In use, initially the error signal is high, resulting in a small value of a1 and relatively low bandwidth. As the mechanical error is reduced, the value of parameter a1 increases, increasing the bandwidth and the error convergence rate. Thus the present controller exhibits the desirable property of improved error convergence rate as the error signal decreases during use. In general as shown in FIG. 4, the error signal is a combination of the mechanical error and the noise error. The mechanical error is affected by the magnitude of the closed-loop transfer function, since the mechanical system 116 is located inside the closed control loop of FIG. 4, but the noise error is not. Therefore, the higher the bandwidth of the controller, the smaller the relative effect of the noise.

With regard to noise reduction, as the mechanical error decreases, it becomes desirable to suppress the relative noise error through the use of a higher bandwidth. This is automatically achieved as a consequence of the particular functional dependence of the value of parameter a1 on the error signal, as shown in FIG. 5.

It is also generally true that the lower the bandwidth, the higher the phase margin and stability. Conversely, the lower the gain, the higher the stability. Thus with regard to stability, the present controller exhibits the desirable property of higher stability, corresponding to situations requiring greater error correction.

Finally, the high error with parameter a1 approaching zero prevents amplifier saturation, without compromising the above described advantages of parameter a1 for low error signal values where amplifier saturation is not a concern. The low error cut-off prevents the quantization discontinuity of the controller 120 in the FIG. 4. The present continuously variable controller allows improved controller performance by varying error convergence rate, noise reduction, and stability in response to a range of error signals. In contrast, the performance characteristics of the prior art constant parameter controller can be optimized for only one error signal value.

This disclosure is illustrative and not limiting; further modifications will be apparent to one skilled in the art and are intended to fall within the scope of the appended claims.

I claim:

1. A controller for positioning a moving body, wherein a position of the body is sensed, the controller comprising:
   an input terminal for receiving a desired position of the body;
   a detector to detect an error value between a current actual location of the body and a current desired position of the body; and
   a control portion connected to the input terminal, wherein the control portion determines to where the body is to be moved as a function of a parameter decreasing in response to an increase in the error value, the control portion providing at an output terminal a signal indicating to where the body is to be moved.

2. The controller of claim 1, wherein the control portion selects a value of the parameter that is a constant where the error value is less than a cutoff value, and is a monotonically decreasing function of the error value where the error value exceeds the cutoff value.

3. A controller for positioning a moving body, wherein a position of the body is sensed, the controller comprising:
   an input terminal for receiving a desired position of the body; and
   a control portion connected to the input terminal, wherein the control portion determines to where the body is to be moved as a function of a parameter varying in response to an error value between a current actual location of the body and a current desired position of the body, the control portion providing at an output terminal a signal indicating to where the body is to be moved; wherein the parameter is designated a1, and the error value is designated error, and
   a1 is proportional to $|error|^\alpha$ for $|error|$ greater than the cutoff value, and
   a1 is proportional to $|cutoff\ value|^\alpha$ for $|error|$ less than or equal to the cutoff value,
   and $\alpha$ has a value less than or equal to zero and greater than $-1$.

4. A controller for positioning a moving body, wherein a position of the body is sensed, the controller comprising:
   an input terminal for receiving a desired position of the body; and
   a control portion connected to the input terminal, wherein the control portion determines to where the body is to be moved as a function of a parameter varying in response to an error value between a current actual location of the body and a current desired position of the body, the control portion providing at an output terminal a signal indicating to where the body is to be moved; wherein the function is a Laplace transform $$G(s)=k*(s+a1)\ (s+a2)/(s*(s+b2)),$$

where s is the Laplace transform complex operator, a1 is the parameter, and a2, b2 and k are constants.

5. The controller of claim 4, wherein in the Laplace transform k is the gain, and the function has two real zeroes, a first simple pole at the origin, and a second real negative simple pole.

6. The controller of claim 5, wherein the second real negative simple pole is located to the left of the real negative zeroes.

7. The controller of claim 5, wherein a first of the real zeroes corresponds to the parameter and has a continuously variable value that decreases monotonically with an increasing error value.

8. The controller of claim 7, wherein for an error value below the cutoff value, a location of the first real zero is limited to a maximum value.

9. The controller of claim 1, wherein the parameter varies continuously.

10. The controller of claim 1, wherein the parameter varies discretely.

11. The controller of claim 1, wherein values of the variable are stored in a look-up table.

12. A method of positioning a movable body, comprising the steps of:
   sensing a current position of the body;
   indicating an intended position of the body;
   finding an error value that is a difference between the current position and the intended position;

selecting a value of a variable parameter corresponding to the error value, the value of the variable parameter decreasing in response to an increase in the error value; and moving the body to a position that is a function of the selected value of the variable parameter.

13. The method of claim 12, wherein the step of selecting comprises selecting a value of the variable parameter that is a constant where the error value is less than a cutoff value and is a monotonically decreasing function of the error value where the error value exceeds the cutoff value.

14. A method of positioning a movable body, comprising the steps of:

sensing a current position of the body;

indicating an intended position of the body;

finding an error value that is a difference between the current position and the intended position;

selecting a value of a variable parameter corresponding to the error value, the value of the variable parameter being a varying function of the error value; and moving the body to a position that is a function of the selected value of the variable parameter; wherein the variable parameter is designated a1 and the error value is designated error, and a1 is proportional to $|error|^\alpha$ for $|error|$ greater than the cutoff value, and a1 is proportional to $|cutoff\ value|^\alpha$ for $|error|$ less than or equal to the cutoff value, and $\alpha$ has a value less than or equal to zero and greater than $-1$.

15. A method of positioning a movable body, comprising the steps of:

sensing a current position of the body;

indicating an intended position of the body;

finding an error value that is a difference between the current position and the intended position;

selecting a value of a variable parameter corresponding to the error value, the value of the variable parameter being a varying function of the error value; and moving the body to a position that is a function of the selected value of the variable parameter; wherein the function is a Laplace transform $$G(s)=k*(s+a1)\ (s+a2)/(s*(s+b2)),$$

where s is the complex operator in the Laplace transform, a1 is the variable parameter, and a2, b2, and k are constants.

16. The method of claim 15, wherein in the Laplace transform k is the gain, and the function has two real negative zeroes, a first simple pole at the origin, and a second real negative simple pole.

17. The method of claim 16, wherein the second real negative simple pole is located to the left of the real negative zeroes.

18. The method of claim 16, wherein a first of the real zeroes corresponds to the variable parameter and has a continuously variable value that decreases monotonically with an increasing error value.

19. The method of claim 18, wherein for an error value below a cutoff value, a location of the first real zero is limited to a maximum value.

20. The method of claim 12, wherein the value of the variable parameter varies continuously.

21. The method of claim 12, wherein the value of the variable parameter varies discretely.

22. The method of claim 12, further comprising the step of looking up the value of the variable parameter in a table.

23. The controller of claim 1, wherein the detector is optically coupled to the body.

24. The controller of claim 1, wherein the body holds reticle on which is formed a pattern.

25. A controller for positioning a moving body, wherein a position of the body is sensed, the controller comprising:

an input terminal for receiving a desired position of the body;

a detector to detect an error value between a current actual location of the body and a current desired position of the body;

a control portion connected to the input terminal, wherein the control portion determines to where the body is to be moved as a function of a parameter decreasing in response to an increase in the error value, the control portion providing at an output terminal a signal indicating to where the body is to be moved; and wherein the control portion selects a value of the parameter that is a constant where the error value is less than a cutoff value, and is a monotonically decreasing function of the error value where the error value exceeds the cutoff value.

\* \* \* \* \*

UNITED STATES PATENT AND TRADEMARK OFFICE
CERTIFICATE OF CORRECTION

PATENT NO. : 5,940,789
DATED : August 17, 1999
INVENTOR(S) : Bausan Yuan

It is certified that error appears in the above-identified patent and that said Letters Patent is hereby corrected as shown below:

Column 4,
Line 43, delete "| error |$^{60}$" and substitute -- | error |$^{\alpha}$ --

Signed and Sealed this

Thirtieth Day of April, 2002

*Attest:*

*Attesting Officer*

JAMES E. ROGAN
*Director of the United States Patent and Trademark Office*